(12) United States Patent
Hotta et al.

(10) Patent No.: US 7,291,862 B2
(45) Date of Patent: Nov. 6, 2007

(54) THIN FILM TRANSISTOR SUBSTRATE AND PRODUCTION METHOD THEREOF

(75) Inventors: Kazushige Hotta, Mie (JP); Takuya Hirano, Kawasaki (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/385,077

(22) Filed: Mar. 21, 2006

(65) Prior Publication Data

US 2006/0289870 A1   Dec. 28, 2006

(30) Foreign Application Priority Data

Mar. 22, 2005   (JP) ............................. 2005-081967

(51) Int. Cl.
H01L 29/76 (2006.01)
(52) U.S. Cl. ............................. 257/72; 257/59; 257/66; 257/69
(58) Field of Classification Search ............... 257/59, 257/64, 66, 72, 75, 88
See application file for complete search history.

(56) References Cited

U.S. PATENT DOCUMENTS 5,789,763 A * 8/1998 Kato et al. ..................... 257/72
6,479,837 B1 * 11/2002 Ogawa et al. ................. 257/59
6,737,672 B2   5/2004 Hara et al.

FOREIGN PATENT DOCUMENTS

| JP | 10-229202 | 8/1998 |
|---|---|---|
| JP | 10-229202 A | 8/1998 |
| JP | 2000-243970 | 9/2000 |
| JP | 2003-086505 | 3/2003 |

* cited by examiner

Primary Examiner—Zandra V. Smith
Assistant Examiner—Paul E Patton
(74) Attorney, Agent, or Firm—Keating & Bennett, LLP

(57) ABSTRACT

A method for producing a thin film transistor substrate includes the steps of: (i) depositing an amorphous semiconductor film on a transparent insulating substrate; (ii) patterning the amorphous semiconductor film so as to form insular amorphous semiconductor films, the step (ii) including a process (I) for forming, in respective stripe areas each of which is elongate in a first direction in a display area, a plurality of insular semiconductor films whose channel length is in line with the first direction, and a process (II) for forming, in an area including extended portions of the striped areas in a peripheral circuit area, a plurality of insular semiconductor films; (iii) polycrystallizing the insular semiconductor films in the peripheral circuit area so that the insular semiconductor films have high mobility in a second direction and polycrystallizing the insular semiconductor films in the display area so that the insular semiconductor films have high mobility in the first direction; and (iv) forming TFTs by using polycrystalline insular semiconductor films. In at least one peripheral circuit, a channel of a high speed TFT is positioned on a portion other than the extended portions of the stripe areas.

5 Claims, 11 Drawing Sheets

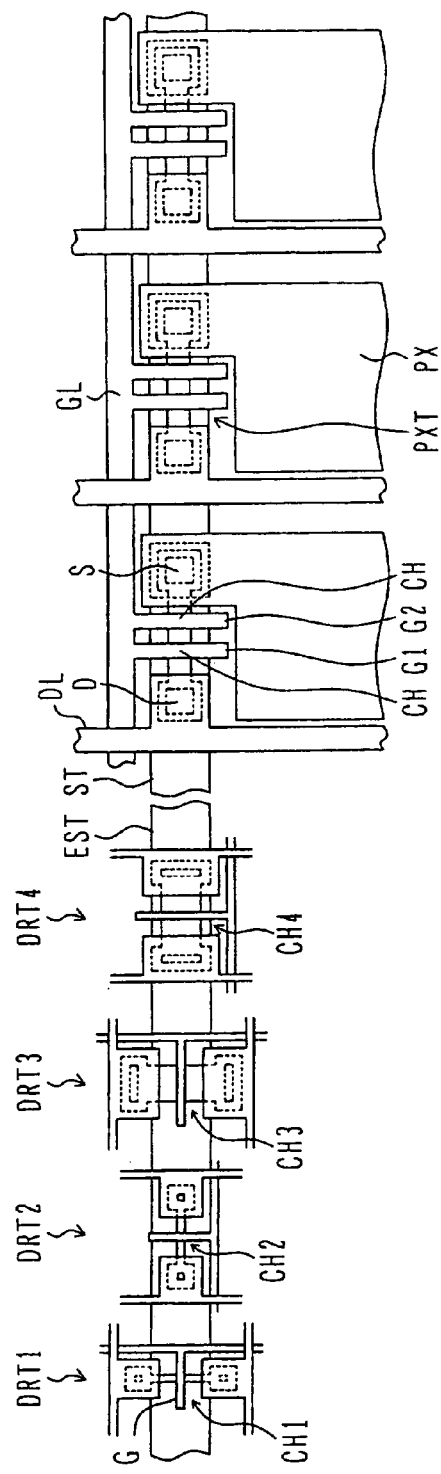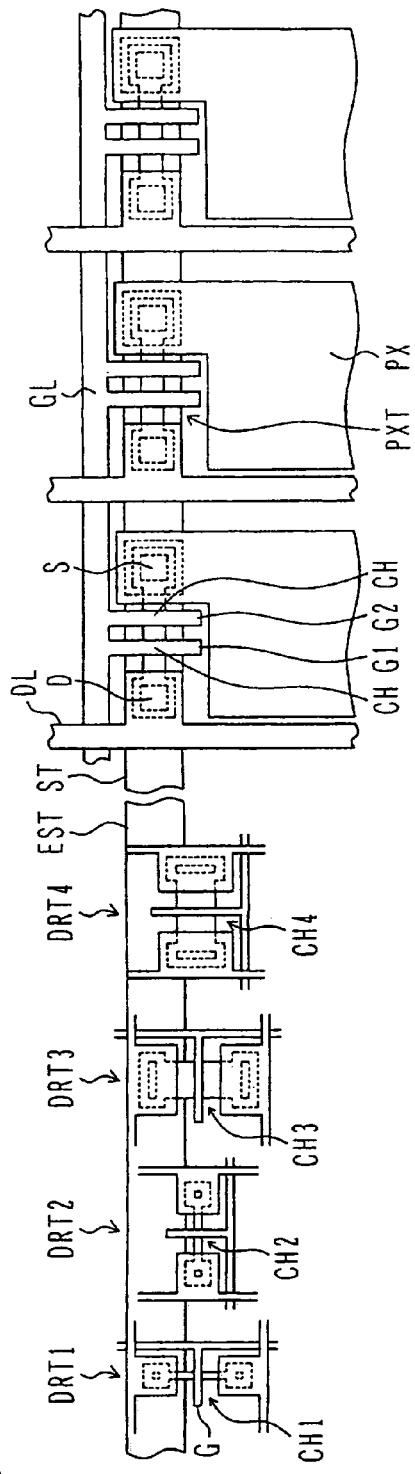
Fig. 2 (A)
Fig. 2 (B)

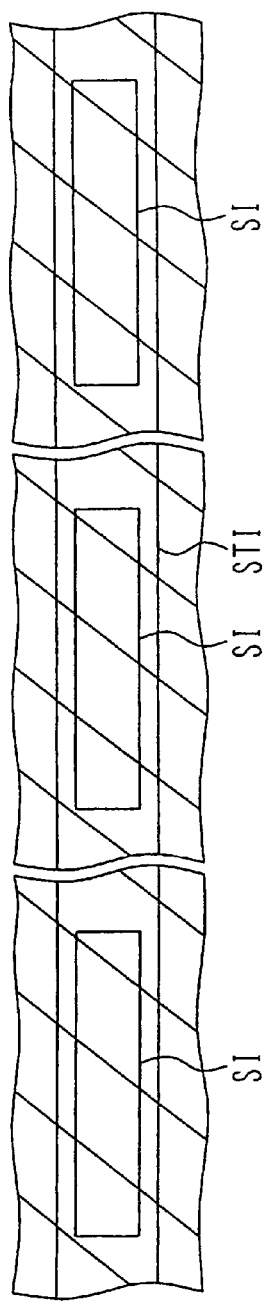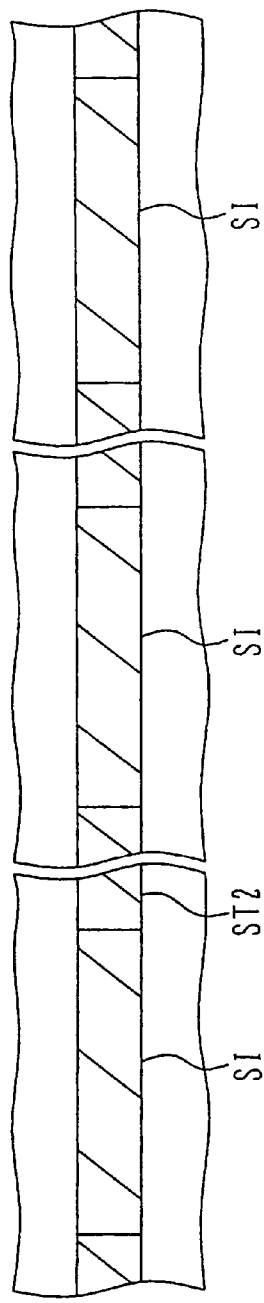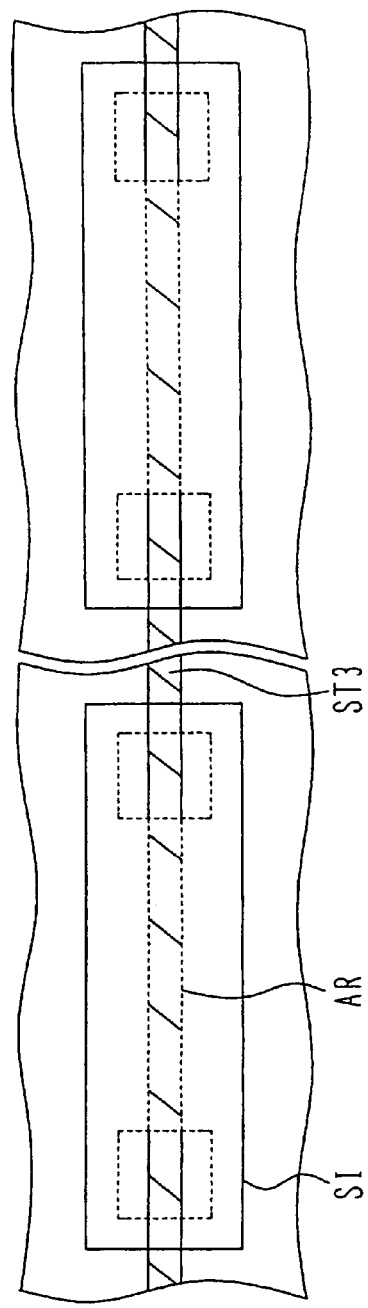
Fig. 4 (A)  Fig. 4 (B)  Fig. 4 (C)

US 7,291,862 B2

THIN FILM TRANSISTOR SUBSTRATE AND PRODUCTION METHOD THEREOF

This non-provisional application claims priority under 35 U.S.C. § 119(a) on Patent Application No. 2005-81967 filed in Japan on Mar. 22, 2005, the entire contents of which are hereby incorporated by reference.

FIELD OF THE INVENTION

The present invention relates to a thin film transistor substrate having a thin film transistor and to a method for producing the thin film transistor substrate. The present invention particularly relates to a thin film transistor substrate using a polycrystalline silicon thin film and to a method for producing the thin film transistor substrate.

BACKGROUND OF THE INVENTION

Recently, a liquid crystal display device or an organic EL display device has been often used as a flat panel display. By using an active matrix substrate in which a switching (active) element such as a thin film transistor (TFT) is formed so as to correspond to each display pixel, it is possible to enhance an ability of a display device. Such active matrix substrate is widely used for a PC (Personal Computer), a mobile phone, and the like.

In a case of forming a thin film transistor (TFT) on a glass substrate, an amorphous silicon film was used because heat-resistant temperature of the glass substrate is limited. Recently, by polycrystallizing the amorphous silicon film, it is possible to realize a polycrystalline silicon transistor with high performance in which mobility is greatly enhanced compared with an amorphous silicon transistor. By using a polycrystalline silicon film, it is possible to also provide a driving circuit on a single substrate. With such arrangement, the polycrystalline silicon film has been developed so as to realize higher performance and lower power consumption.

There is used a technology in which excimer laser light having a long-slit shape scans and polycrystallizes an amorphous silicon film. Pulse-oscillating excimer laser light is concentrated so as to have a long-slit beam shape, thus concentrated beam scans in a short-side direction of the beam, thereby efficiently polycrystallizing the amorphous silicon film with a large area.

Japanese Unexamined Patent Publication No. 229202/1998 (Tokukaihei 10-229202; published on Aug. 25, 1998) discloses that: when excimer laser light having a long-slit shape scans in a short-side direction, crystal grain sizes are even in a long-side direction, but there are formed a region with a large crystal grain size and a region with a small crystal grain size in a scanning direction, and therefore a channel length direction should be a direction in which mobility is not reduced by the region with a small crystal grain size (direction vertical to the scanning direction).

This disclosure depends on the fact that: whether the size of a crystal grain in a silicon film having been polycrystallized by excimer laser is large or not determines whether mobility is large or not. Further, it is disclosed that: in polycrystallization by excimer laser, crystalline characteristics differ according to a scanning direction.

Japanese Unexamined Patent Publication No. 243970/2000 (Tokukai 2000-243970; published on Sep. 8, 2000, corresponding U.S. Pat. No. 6,479,837 B1) discloses that: when a silicon thin film is scanned by KrF (XeCl) excimer laser light having a band shape (the laser light is even in a long side direction and has intensity distribution in a short side direction) and polycrystallized, a crystal grain of thus polycrystallized silicon thin film has an ellipse shape which is elongate in a scanning direction (e.g. grain size in a long side direction is 3 through 5 μm and grain size in a short side direction is 0.5 through 2 μm).

According to Japanese Unexamined Patent Publication No. 243970/2000, when a gate length direction and a long side direction of a crystal grain are substantially parallel to each other, high mobility (e.g. 480 $cm^2$/Vsec) was obtained. Japanese Unexamined Patent Publication No. 243970/2000 suggests an arrangement in which a gate length direction of a thin film transistor is made substantially parallel to a direction in which higher characteristic is realized (hereinafter, this direction is referred to as a higher characteristic direction and means the scanning direction in which high mobility is realized) and accordingly mobility of a carrier is increased.

Further, Japanese Unexamined Patent Publication No. 86505/2003 (Tokukai 2003-86505; published on Mar. 20, 2003) discloses a technique in which an amorphous semiconductor film is patterned so as to have an insular shape and then solid laser (DPSS laser) with semiconductor (LD) excitation emits CW laser light to the amorphous semiconductor film from a back face of a transparent substrate, thereby polycrystallizing the amorphous semiconductor film. It is explained that: this method realizes a large crystal grain.

Polycrystallization using a continuous wave (CW) laser having a spot-like beam shape is performed in such a manner that: a semiconductor film is made insular and then scanned by the CW laser light so as to be polycrystallized. Polycrystalline silicon obtained through crystallization which is called "lateral growth" has a long crystal grain in a scanning direction. Mobility in a scanning direction is higher than mobility in a direction vertical to the scanning direction. A thin film transistor having a channel length direction parallel to the scanning direction has a higher characteristic than a thin film transistor having a channel length direction vertical to the scanning direction. Therefore, the scanning direction in which high mobility is realized is referred to as a higher characteristic direction and the direction which results in low mobility and is vertical to the scanning direction is referred to as a lower characteristic direction.

FIG. 7(A) schematically illustrates a TFT whose channel length direction is made parallel to a higher characteristic direction. A polycrystalline silicon film 101 has a higher characteristic direction D1 in a vertical direction and is elongate in a vertical direction and widens its width at both ends. Source/drain electrodes S/D are connected with the polycrystalline silicon film 101 at portions obtained by widening the polycrystalline silicon film 101. A gate electrode G is formed so as to cross an intermediate narrow portion of the polycrystalline silicon film 101 and a channel is defined in the polycrystalline silicon film 101 so as to be a portion where the gate electrode G overlaps with the polycrystalline silicon 101. A channel length direction D2 is a vertical direction and therefore coincides with the higher characteristic direction D1. At that time, high mobility can be obtained for the TFT.

FIG. 7(B) schematically illustrates a TFT whose channel length direction is vertical to the higher characteristic direction. A polycrystalline silicon film 102 has a higher characteristic direction D1 in a vertical direction and is elongate in a horizontal direction and widens its width at both ends. The source/drain electrodes S/D are connected with the polycrystalline silicon film 102 at portions obtained by widening the polycrystalline silicon film 102. A gate electrode G is formed so as to cross an intermediate narrow portion of the polycrystalline silicon film 102 and a channel is defined in the polycrystalline silicon film 102 so as to be a portion where the gate electrode G overlaps with the polycrystalline silicon 102. A channel length direction D2 is a horizontal direction and therefore crosses the higher characteristic direction D1. At that time, only low mobility can be obtained for the TFT.

An arrangement in which a driving circuit is integrated on an active matrix substrate of a liquid crystal display device is developed. The driving circuit of the liquid crystal display device includes a display controller and a shift register which should operate at high speed. It is preferable that a TFT which should operate at high speed has high mobility. It is also preferable that a transistor which needs a high driving ability, such as an analog switch, has high mobility.

FIGS. 7(C) and 7(D) schematically illustrate how to polycrystallize an active matrix substrate. As illustrated in FIG. 7(C), a display area 111 on which pixels are to be formed is defined at a central portion of a glass substrate 110. Pixel TFTs are disposed discretely so that each of the pixel TFTs corresponds to a pixel. Drain side driving circuit areas 112 are defined above and below the display area 111 and TFTs for a driving circuit are disposed in a high density manner. Gate side driving circuit areas 113 are defined at right and left of the display area 111 and the TFTs for a driving circuit are disposed in a high density manner. The drain side driving circuit areas 112 and the gate side driving circuit areas 113 are collectively termed "a peripheral circuit area". Before polycrystallization is performed, an insular (ribbon-shaped) silicon film has been formed by patterning so as to correspond to each TFT.

As illustrated in FIG. 7(C), firstly, whole surfaces of the peripheral circuit areas on which insular silicon films are formed in a high density manner are scanned by CW laser light. CW laser light scans in a direction parallel to a longer side of each of the peripheral circuit areas, moves in a crossing direction, scans parallel to the longer side in an inverse direction, further moves in a crossing direction, and so on. With such scanning, there is formed a polycrystalline silicon film whose higher characteristic direction is parallel to a direction illustrated by a thick arrow in FIG. 7(C). In order to obtain high mobility, the insular silicon film is disposed so that the channel length direction is parallel to the higher characteristic direction.

As illustrated in FIG. 7(D), polycrystallization of the insular silicon film for a pixel TFT on the display area is subsequently performed. Pixels are disposed in a matrix manner on the display area and gate wiring is disposed so as to correspond to each pixel row and drain wiring is disposed so as to correspond to each pixel column. Wiring that extends from the gate wiring forms a gate electrode and wiring that extends from drain wiring forms a drain electrode. In such disposition, it is convenient that a direction combining a source and a drain is regarded as a row direction. The channel length direction is a horizontal direction and accordingly there is used an insular silicon film which is elongate in a horizontal direction. Polycrystallization is performed by irradiating CW laser light to insular silicon films with respect to each pixel row in a lateral direction. CW laser light is not irradiated in the column direction because the insular silicon films do not exist in the column direction.

The inventors of the present invention found that a problem occurs in the foregoing polycrystallization process.

SUMMARY OF THE INVENTION

An object of the present invention is to provide (i) a thin film transistor substrate including a peripheral circuit capable of preventing damage on a characteristic of a thin film transistor in a polycrystallization process and (ii) a method for producing the thin film transistor substrate.

Further, an object of the present invention is to provide a thin film transistor substrate capable of maintaining a desired characteristic of a thin film transistor even when a peripheral circuit area is defined on an extended portion of a stripe area where TFTs of a display area are disposed in a line and then a thin film transistor is formed on the extended portion.

A feature of the present invention is a thin film transistor substrate including: a transparent insulating substrate which includes a display area and a peripheral area; a large number of pixel thin film transistors which are disposed in a matrix manner on the display area, each of said pixel thin film transistors including a channel made of a polycrystalline semiconductor film whose mobility is higher in a first direction than in another direction, a channel length direction being in line with the first direction, and channels included in a plurality of pixel thin film transistors being disposed respectively in stripe areas each of which has a predetermined width and is elongate in the first direction; and a plurality of peripheral circuits which are disposed in the peripheral area so as to be positioned on a portion including extended portions of the stripe areas and which include a large number of thin film transistors each made of a polycrystalline semiconductor film whose mobility is higher in a second direction crossing the first direction than in another direction, at least one peripheral circuit out of said plurality of peripheral circuits including a high speed thin film transistor whose channel length direction is in line with the second direction, and a channel of the high speed thin film transistor being positioned on a portion other than the extended portions of the stripe areas.

Another feature of the present invention is a method for producing a thin film transistor substrate, including the steps of: (i) depositing an amorphous semiconductor film on a transparent insulating substrate including a display area and a peripheral area; (ii) patterning the amorphous semiconductor film so as to form insular amorphous semiconductor films, said step (ii) including a process (I) for forming, in respective stripe areas each of which has a predetermined width and is elongate in a first direction in the display area, insular semiconductor films used to form pixel thin film transistors whose channel length direction is in line with the first direction and a process (II) for forming, in a peripheral circuit area including extended portions of the stripe areas in the peripheral area, insular semiconductor films used to form peripheral circuit thin film transistors for forming each of a plurality of peripheral circuits; (iii) polycrystallizing the insular semiconductor films in the peripheral circuit area so that the insular semiconductor films have high mobility in a second direction different from the first direction and polycrystallizing the insular semiconductor films in the display area so that the insular semiconductor films have high mobility in the first direction; and (iv) forming thin film transistors by using the polycrystalline insular semiconductor films, wherein at least one peripheral circuit out of the peripheral circuits includes a high speed thin film transistor whose channel length direction is in line with the second direction, and a channel of the high speed thin film transistor is positioned on a portion other than extended portions of the stripe areas.

Further feature of the present invention is a method for producing a thin film transistor substrate, including the steps of: (i) depositing an amorphous semiconductor film on a transparent insulating substrate including a display area and a peripheral area; (ii) patterning the amorphous semiconductor film so as to form insular amorphous semiconductor films, said step (ii) including a process (I) for forming, in respective stripe areas each of which has a predetermined width and is elongate in a first direction in the display area, insular semiconductor films used to form a plurality of pixel thin film transistors whose channel length direction is in line with the first direction and a process (II) for forming, in a peripheral circuit area including an extended portions of the stripe areas in the peripheral area, insular semiconductor films used to form peripheral circuit thin film transistors for forming each of a plurality of peripheral circuits; (iii) polycrystallizing the insular semiconductor films in the display area so that the insular semiconductor films have high mobility in the first direction; (iv) polycrystallizing, after the step (iii), the insular semiconductor films in the peripheral circuit area so that the insular semiconductor films have high mobility in a second direction different from the first direction; and (v) forming thin film transistors by using the polycrystalline insular semiconductor films.

When an area is polycrystallized by scanning of laser light in a certain direction and then receives irradiated laser light scanning in another direction, crystal characteristics are out of order and a characteristic of a thin film transistor is damaged. Currently, it is difficult to minutely control where to irradiate laser light in a scanning direction. However, with the foregoing arrangements, a channel requested to have a desired characteristic is positioned on a portion other than a portion where crystal characteristics may be out of order, with a result that it is possible to reduce the influence of disorders of crystal characteristics.

Further, when a semiconductor film is polycrystallized twice, second polycrystallization has a greater influence on the characteristic of the semiconductor film. Therefore, by polycrystallizing the peripheral circuit area after the display area, it becomes easy to secure a TFT characteristic of the peripheral circuit area.

For a fuller understanding of the nature and advantages of the invention, reference should be made to the ensuing detailed description taken in conjunction with the accompanying drawings.

BRIEF DESCRIPTION OF THE DRAWINGS

FIGS. 2(A) and 2(B) are plan views schematically illustrating structures of thin film transistor substrates according to a second embodiment of the present invention.

FIGS. 4(A) through 4(C) are plan views illustrating three types of CW laser light irradiation areas.

DESCRIPTION OF THE EMBODIMENTS

With reference to drawings, the following explains an embodiment of the present invention.

TFTs having different properties are used for a liquid crystal display device. Examples of the TFTs include a TFT which should be operated at high speed and should have high mobility and a TFT which does not operate at high speed and need not have high mobility.

Figure 8:
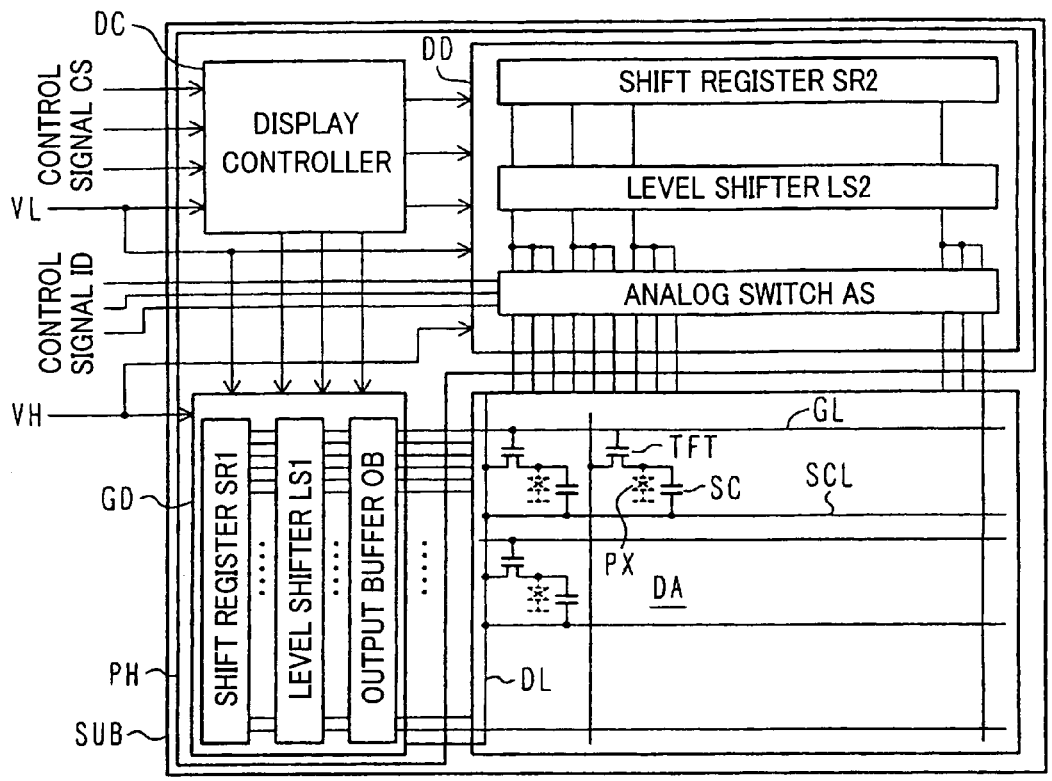
FIGS. 8(A) through 8(C) are plan views schematically illustrating a structure of a TFT substrate for a liquid crystal display device and polycrystalline structures.
Figure 8:
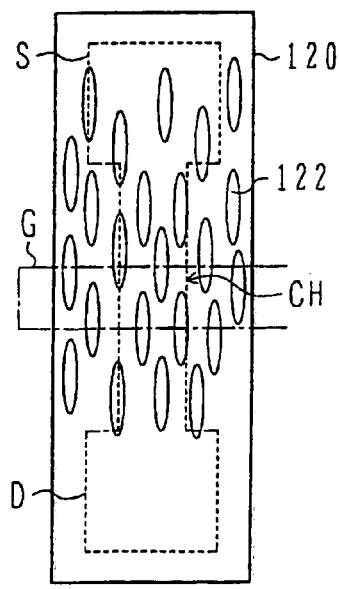
Figure 8:
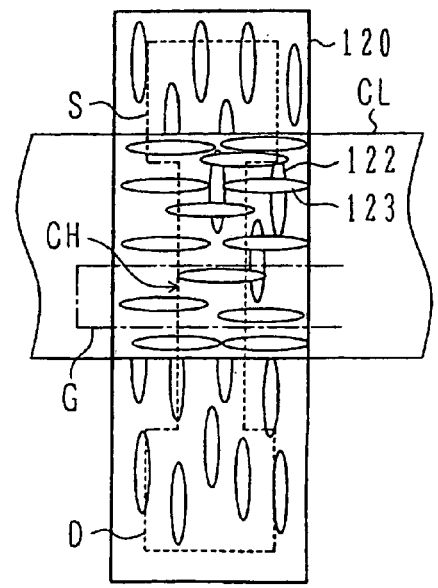

FIG. 8(A) illustrates an example of a structure of an active matrix substrate. A display area DA for performing display and a peripheral circuit area PH for forming a peripheral circuit are defined on an insulating transparent substrate SUB such as a glass substrate. On the display area DA, a plurality of scanning gate wirings (bus lines) GL are extended in a row (horizontal) direction and a plurality of image data (drain) wirings (bus lines) DL for supplying image data are extended in a column (vertical) direction.

A thin film transistor TFT is connected with each junction of the scanning gate wiring GL and the image data wiring DL. An output terminal of the thin film transistor is connected with a pixel electrode PXE made of a transparent electrode such as an ITO. Further, an auxiliary capacitor SC is connected with each pixel electrode PXE. Further, the other electrode of the auxiliary capacitor SC is connected with auxiliary capacitor wiring (bus line) SCL having a predetermined potential. The auxiliary capacitor wiring SCL extends in the row direction. However, the auxiliary capacitor wiring SCL may extend in the column direction.

Figure 7:
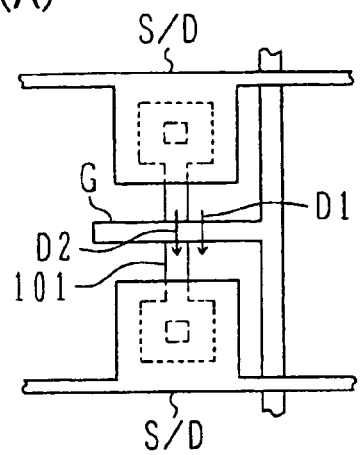
FIGS. 7(A) through 7(D) are plan views explaining how to produce a TFT substrate for a liquid crystal display device.
Figure 7:
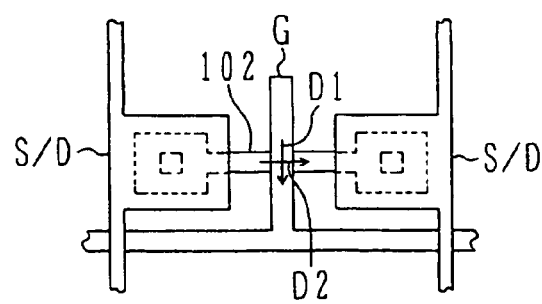
Figure 7:
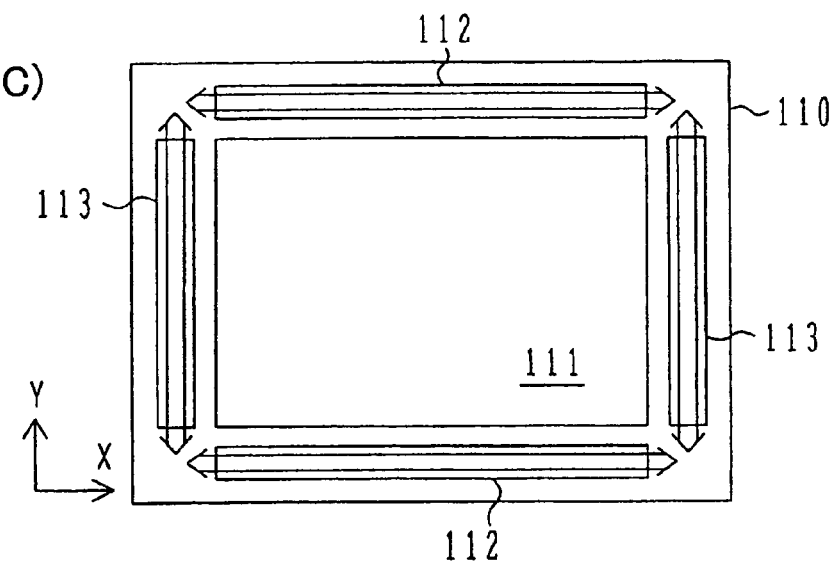
Figure 7:
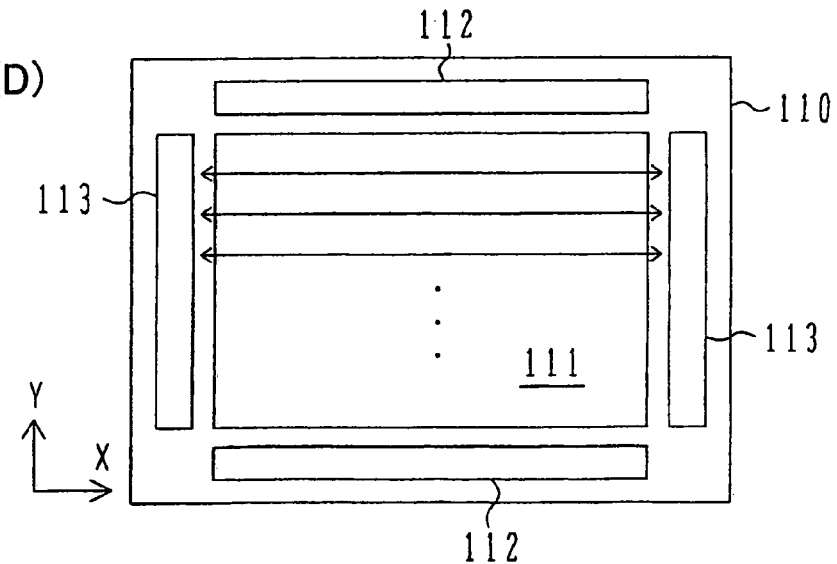

On the peripheral circuit area PH, there are formed a gate side driving circuit GD for generating a scanning signal to be supplied to the scanning gate wirings, a drain side driving circuit DD for supplying image data to be supplied to image data wirings, and a display controller DC for controlling the gate side driving circuit GD and the drain side driving circuit DD. The gate side driving circuit GD includes a shift register SR 1, a level shifter LS 1, an output buffer OB, and the like. The drain side driving circuit DD includes a shift register SR 2, a level shifter LS 2, an analog switch AS, and the like. Further, reference voltages VL and VH and an image signal ID are supplied from an outside. In FIG. 8(A), driving circuits are disposed only at an upper side and a left side of the display area. However, as illustrated in FIGS. 7(C) and 7(D), the driving circuits may be disposed at both an upper side and a lower side and at both a right side and a left side.

In the active matrix substrate to which peripheral circuits are integrated, it is requested that the display controller DC and the shift registers SR 1 and SR 2 operate at relatively high speed. It is desirable that the analog switch AS has a high driving ability.

The level shifters LS 1 and LS 2, the output buffer OB, the analog switch AS, and a switching thin film transistor (TFT) which is used in the display area are required to have relatively high voltage resistance. A high voltage TFT for a driving circuit and a pixel TFT are made of a high voltage TFT. Even when a TFT in the display area DA is made of only an n channel TFT, it is preferable that the peripheral circuit PH is constituted of a CMOS circuit. Therefore, in addition to the n channel TFT, a p channel TFT is formed.

In a circuit for a display device using polycrystalline silicon, a MOS capacitor is generally used as an auxiliary capacitor.

A voltage of not less than 7 through 10V is applied on the pixel TFT so that a voltage necessary for driving liquid crystal is maintained. Therefore, it is necessary to make a gate insulating film fully thick so as to cause a gate to have high voltage resistance. When a peripheral circuit TFT is made of a TFT having the same structure as the pixel TFT, the peripheral circuit needs a high voltage while operating and requires higher power consumption.

When an amorphous (a-) Si film is crystallized through irradiation of CW laser, a crystal with a large grain size can be obtained. It is desirable that the a-Si film has a thickness of not less than 50 nm. By polycrystallization with CW laser, there is formed a polycrystalline silicon film having such crystal orientation that a grain size is large and mobility is high in a scanning direction. In order to form a TFT which operates at high speed or has a high driving current, it is necessary to dispose a channel length direction so that the channel length direction is in line with crystal orientation.

Because the shift register in the drain side driving circuit is disposed so as to be in a row direction, it is preferable in design that the channel length direction is in line with the row direction. Because a large amount of a current flows in the analog switch, it is preferable that transistors having high gate widths, for example, a source area and a drain area having an interdigital shape, are disposed so as to be opposite to each other. It is preferable that the source area extends downward from an upper side and the drain area extends upward from a lower side so that the source area faces the drain area in the row direction. With the arrangement, polycrystallization illustrated in FIG. 7(C) allows the TFT to realize high mobility.

Because the shift register in the gate side driving circuit is disposed so as to be in a column direction, it is preferable in design that the channel length direction is in line with the column direction. With the arrangement, polycrystallization illustrated in FIG. 7(C) allows the TFT to realize high mobility. However, it was found that: when a TFT is made of a polycrystalline silicon film as illustrated in FIGS. 7(C) and 7(D), a TFT having a deteriorated characteristic is formed in the gate side driving circuit. The TFT having a deteriorated characteristic exists on an extended portion of a stripe area to which CW laser is irradiated so that an insular silicon area in the display area is polycrystallized.

A main part of the active matrix substrate is the display area and accordingly a peripheral area (frame area) in which the driving circuit is disposed has a narrow space. When CW laser light scans so as to polycrystallize the display area, it is difficult to cause the CW laser light to stop scanning exactly at a periphery of the display area. Therefore, it is deemed that the gate side driving circuit area also receives the irradiated CW laser light.

FIG. 8(B) illustrates an insular silicon film in the gate side driving circuit area after the peripheral circuit area has been polycrystallized. An insular silicon film 120 which is elongate in a column direction is formed so that a source S, a channel CH, and a drain D are disposed in a column direction. A crystal grain 122 which is elongate in a column direction is formed by CW laser light scanning in a column direction. When a TFT is formed in this state, high mobility can be obtained.

FIG. 8(C) schematically illustrates a state in which: CW laser light CL scans the insular silicon film 120 in the display area in a row direction for polycrystallization and the CW laser light CL is irradiated twice to a part of thus polycrystallized silicon film 120. Because of irradiation of CW laser light, a crystal grain 123 which is elongate in the row direction is produced. There is a possibility that the crystal grain 122 having been made by scanning of the previous CW laser light still remains, but the crystal grain 122 does not remain with its original shape. In an area of the crystal grain 123, though mobility in the row direction is high, mobility in the column direction is low. Therefore, mobility effective as a TFT drops. In this way, the characteristic of the polycrystalline semiconductor film is damaged.

In order to prevent the characteristic of the TFT from being damaged, laser light should not be irradiated twice to the TFT semiconductor film. Strictly speaking, how fast a TFT operates is determined by its channel. Therefore, when laser light is not irradiated twice to a channel of the TFT, it is possible to reduce the damage on the characteristic of the TFT.

Figure 1A:
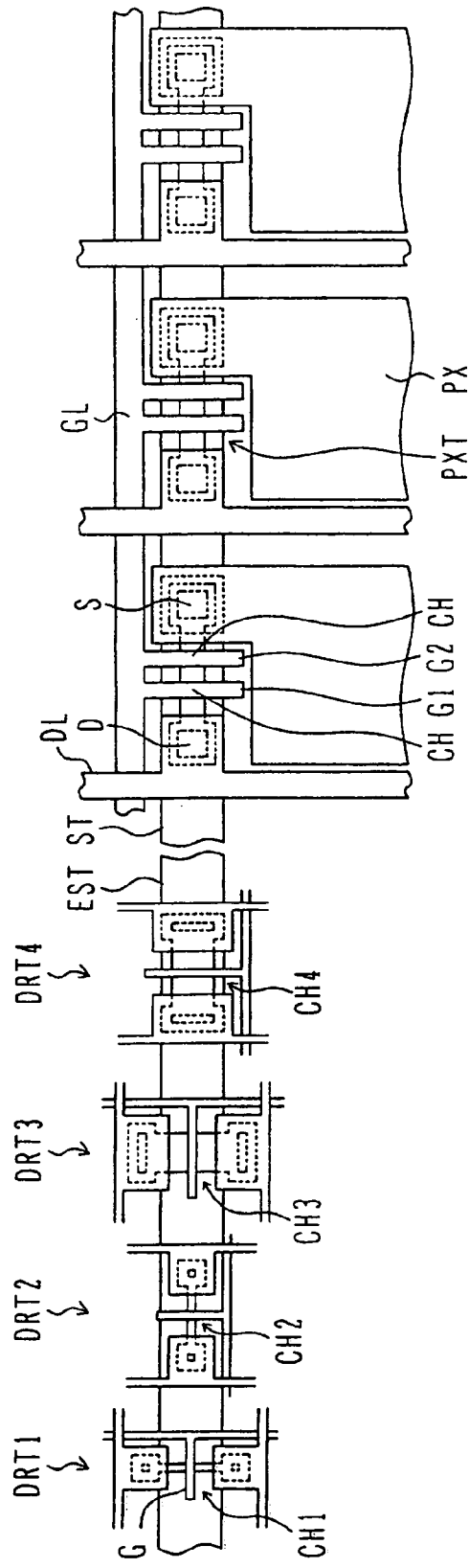
FIGS. 1(A) and 1(B) are plan views schematically illustrating structures of thin film transistor substrates according to a first embodiment of the present invention.
Figure 1B:
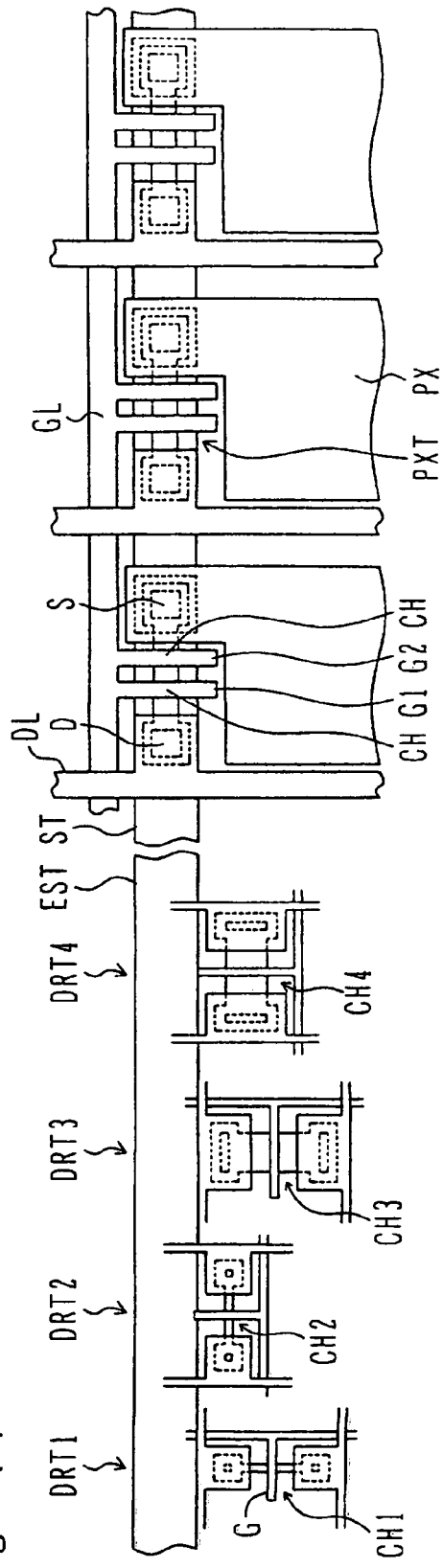

FIGS. 1(A) and 1(B) are plan views illustrating structures of thin film transistor substrates according to a first embodiment of the present invention.

FIG. 1(A) illustrates a structure of a thin film transistor substrate without any arrangement for avoiding the damage on the characteristic of a TFT. A display area is illustrated at a right side of FIG. 1(A) and a gate side driving circuit is illustrated at a left side of FIG. 1(A). In the display area, pixels are disposed in a matrix manner, a gate line GL is disposed in line with each pixel row and a drain line DL is disposed in line with each pixel column. A pixel thin film transistor PXT is disposed at a left-upper corner of each pixel.

The pixel thin film transistor PXT includes a drain D connected with the drain line, a source S connected with a pixel electrode PX, double gates G 1 and G 2 connected with the gate line GL, and a channel CH under a gate. A channel length direction is a horizontal row direction.

In the gate side driving circuit, thin film transistors DRT 1, DRT 2, DRT 3, and DRT 4 are illustrated as representatives. The thin film transistors DRT 1 and DRT 2 have channels CH 1 and CH 2, respectively, under the gate electrode G. The channels CH 1 and CH 2 have narrow channel widths. The thin film transistors DRT 3 and DRT 4 have channels CH 3 and CH 4, respectively, above the gate electrode G. The channels CH 3 and CH 4 have wide channel widths and large driving currents. The channel length directions of the thin film transistors DRT 1 and DRT 3 are vertical column directions and the channel length directions of the thin film transistors DRT 2 and DRT 4 are horizontal row directions.

Because a semiconductor layer of the gate side driving circuit is polycrystallized by scanning of CW laser light in a vertical direction, the semiconductor layer of the gate side driving circuit has high mobility in a vertical direction. Therefore, it is expected that the thin film transistors DRT 1 and DRT 3 have high mobility. However, the channels CH 1 through CH 4 of the thin film transistors DRT 1 through DRT 4 exist on an extended portion of the stripe area ST to which laser right is irradiated so that a semiconductor layer for the pixel thin film transistor PXT is polycrystallized. As a result, the channels CH 1 through CH 4 as well as the semiconductor layer for the pixel thin film transistor PXT are likely to receive irradiated laser light. As such, crystal orientation in a horizontal direction is superimposed on crystal orientation in a vertical direction and accordingly the characteristic of the polycrystalline semiconductor layer is damaged.

FIG. 1(B) illustrates a structure of a TFT having been arranged so as to avoid the damage. The display area is the same as that illustrated in FIG. 1(A). In the gate side driving circuit, semiconductor films of all TFTs are displaced out of a linear extended portion EST of a laser light irradiation stripe area ST to which laser light is irradiated in the display area. Therefore, polycrystallization of the display area does not have an influence on the TFT in the gate side driving circuit.

This arrangement is safe. However, the semiconductor films of the TFT cannot be disposed on the extended portion EST of the laser light irradiation stripe area ST at all and accordingly the design is significantly limited. The following explains another arrangement for reducing the limitation on the design.

FIGS. 2(A) and 2(B) are plan views illustrating structures of thin film transistor substrates according to a second embodiment of the present invention. FIG. 2(A) illustrates initial disposition that is likely to be subject to the damage as with FIG. 1(A). FIG. 2(B) illustrates disposition of TFTs in which a channel having an influence on an ability of a transistor is displaced out of the extended portion EST of the laser light irradiation stripe area ST. As long as the channel is not damaged, even when the source S and the drain D having high density of impurity receives irradiated laser light in different scanning directions, there is little influence on the characteristic of the transistor. Because the TFT is displaced in consideration of only the channel, it is possible to reduce the limitation on the design. Particularly, it is possible to reduce amounts of displacements of the thin film transistors DRT 1 and DRT 3 having the channel length directions in a vertical direction.

The foregoing explains an arrangement applicable to all the TFTs in the gate side driving circuit. The gate side driving circuit includes a plurality of circuits and even when characteristics of some circuits change, there is little influence on characteristics of all circuits. Instead of displacing all the circuits, it is possible to displace only a circuit, having a high characteristic, which operates at the highest velocity.

Figure 3:
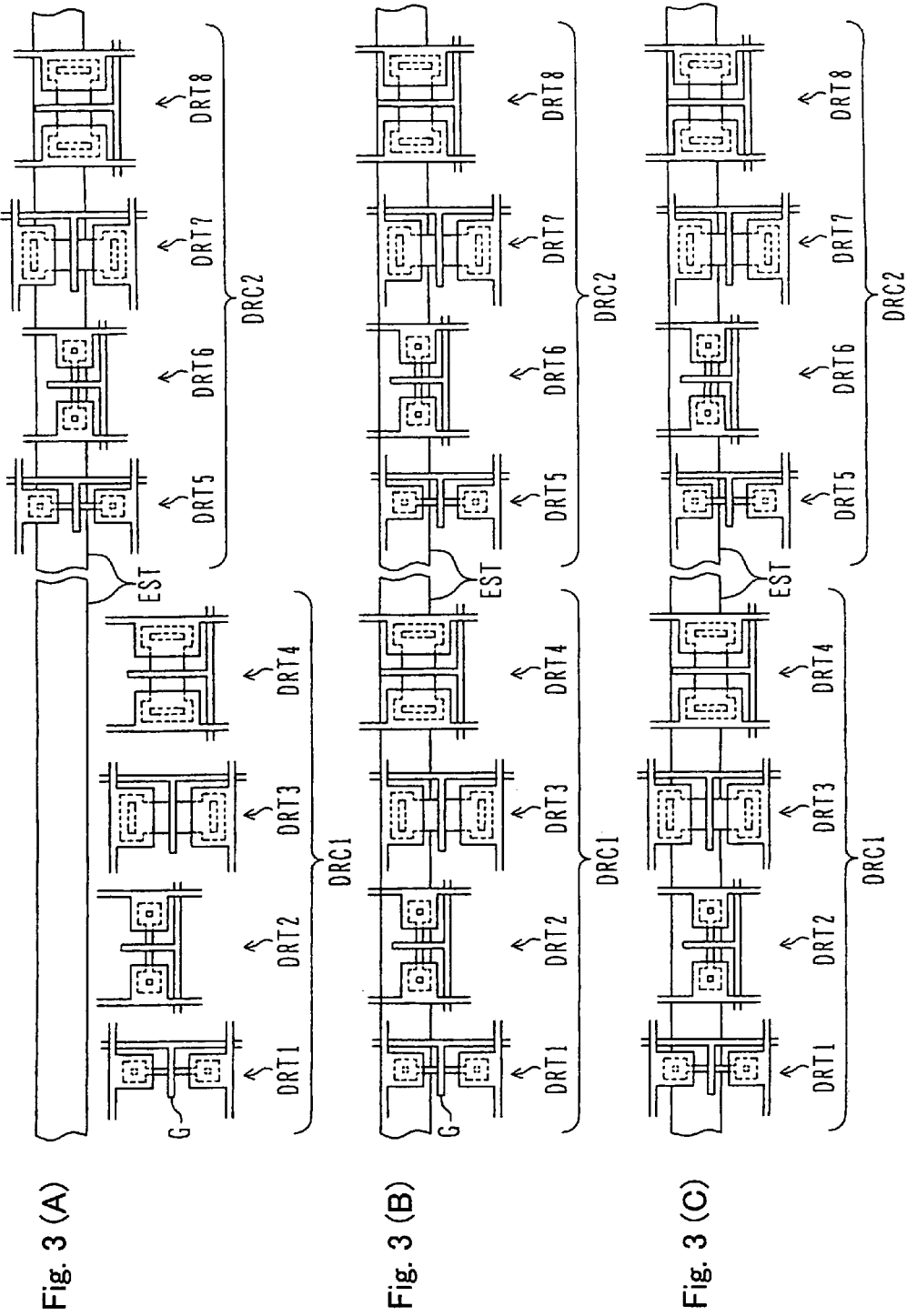
FIGS. 3(A) through 3(C) are plan views schematically illustrating structures of thin film transistor substrates according to a third embodiment of the present invention.

FIG. 3(A) illustrates an embodiment in which the arrangement for avoiding the damage on a TFT is made according to the type of circuits. A circuit DRC 1 at a left side of FIG. 3(A) is a circuit having a great influence on characteristics of all the circuits. Therefore, in the DRC 1, thin film transistors DRT 1, DRT 2, DRT 3, and DRT 4 are displaced out of an extended portion EST of a laser light irradiation stripe area ST. On the other hand, a circuit DRC 2 at a right side of FIG. 3(A) has little influence on the characteristics of all the circuits and accordingly no displacement is performed. Therefore, in the DRC 2, thin film transistors DRT 5, DRT 6, DRT 7, and DRT 8 are still disposed on the extended portion EST of the laser light irradiation stripe area ST.

FIG. 3(B) illustrates an embodiment focusing attention on the channel length direction. In the gate side driving circuit, laser light for polycrystallization is irradiated in a vertical direction and accordingly the characteristic of the TFT whose channel length direction is vertical is high. Therefore, channels of thin film transistors DRT 1, DRT 3, DRT 5, and DRT 7 whose channel length directions are vertical are displaced out of the extended portion EST of the laser light irradiation stripe area ST. On the other hand, thin film transistors DRT 2, DRT 4, DRT 6, and DRT 8 whose channel length directions are horizontal have low mobility and accordingly hardly influenced by the damage on the characteristic of a TFT. Therefore, the thin film transistors DRT 2, DRT 4, DRT 6, and DRT 8 are not displaced but remain on the extended portion EST of the laser light irradiation stripe area ST. As a result, it is possible to reduce the number of TFTs to be displaced. Further, because only channels are displaced, it is possible to reduce the amount of displacement. Therefore, the limitation on the design is reduced.

FIG. 3(C) illustrates an embodiment in which the bare minimum of TFTs are displaced in consideration of the channel length direction and a necessary characteristic such as working speed. The circuit DRC 1 has little influence on characteristics of all the circuits when the circuit DRC 1 is damaged. Therefore, the circuit DRC 1 is not displaced but remains on the extended portion EST of the laser light irradiation stripe area ST. The circuit DRC 2 has a high characteristic and accordingly is influenced by the damage. In the circuit DRC 2 having a high characteristic, channels of thin film transistors DRT 5 and DRT 7 which have a high characteristic and whose channel length is vertical are displaced out of the extended portion EST when the channels are disposed within the extended portion EST.

There is a case where transistors differently influenced by the damage exist in a single circuit. For example, in a case where the circuits DRC 1 and DRC 2 constitute a single circuit and thin film transistors DRT 5 and DRT 7 whose channel length directions are vertical are requested to have a high characteristic and are greatly influenced by the damage, channels of only the DRT 5 and DRT 7 out of thin film transistors whose channel length directions are vertical are displaced out of the extended portion EST of the laser light irradiation stripe area ST.

Next, the following explains a width of a laser light irradiation area.

FIGS. 4(A) through 4(C) illustrate three states concerning how to irradiate laser light. In FIG. 4(A), a laser light irradiation area ST 1 whose width includes (i) a width of an insular semiconductor film SI of the display area and (ii) a positioning error is set. By irradiating laser light to the laser light irradiation area ST 1, it is possible to polycrystallize a whole insular area even when an error occurs in positioning the insular semiconductor film SI.

FIG. 4(B) illustrates a case where accuracy of positioning is increased and a laser light irradiation area ST 2 whose width is substantially the same as the insular semiconductor film SI is set. By limiting the width of the laser light irradiation area ST 2, it is possible to reduce a width of an area which needs arrangement for avoiding the damage on the characteristic of an TFT in the gate side driving circuit. When the accuracy of positioning is high, it is possible to polycrystallize a whole area of the insular semiconductor film SI.

FIG. 4(C) illustrates a polycrystallization process focusing attention not on the whole area of the insular semiconductor film SI but on an activated region AR constituting a channel. In a semiconductor film having a transistor shape obtained by removing a peripheral part from the insular semiconductor film SI and patterning the film SI, the region constituting a channel has a further narrower width. A laser light irradiation area ST 3 is set to have a narrow width so that laser light is irradiated only to a channel area of a thin film transistor to be formed, with a result that only a part of the insular semiconductor film SI is polycrystallized. A source/drain region with a large width has a region that is not polycrystallized. However, by adding a large amount of impurity to the source/drain region and causing the source/drain region to contact an electrode at a large area, it is possible to maintain a sufficiently low resistance.

FIGS. 5(A) through 5(M) schematically illustrate a method for producing a thin film transistor substrate.

Figure 5:
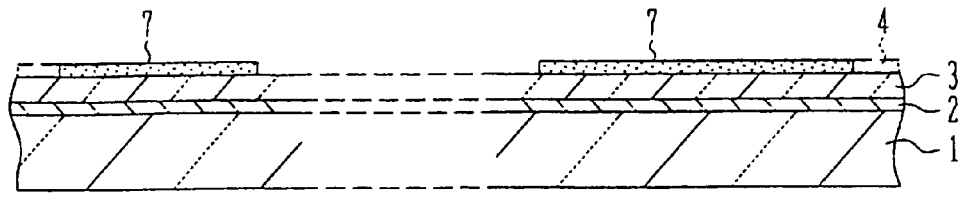
FIGS. 5(A) through 5(M) are sectional views and plan views illustrating essential processes of how to produce a thin film transistor substrate.
Figure 5:
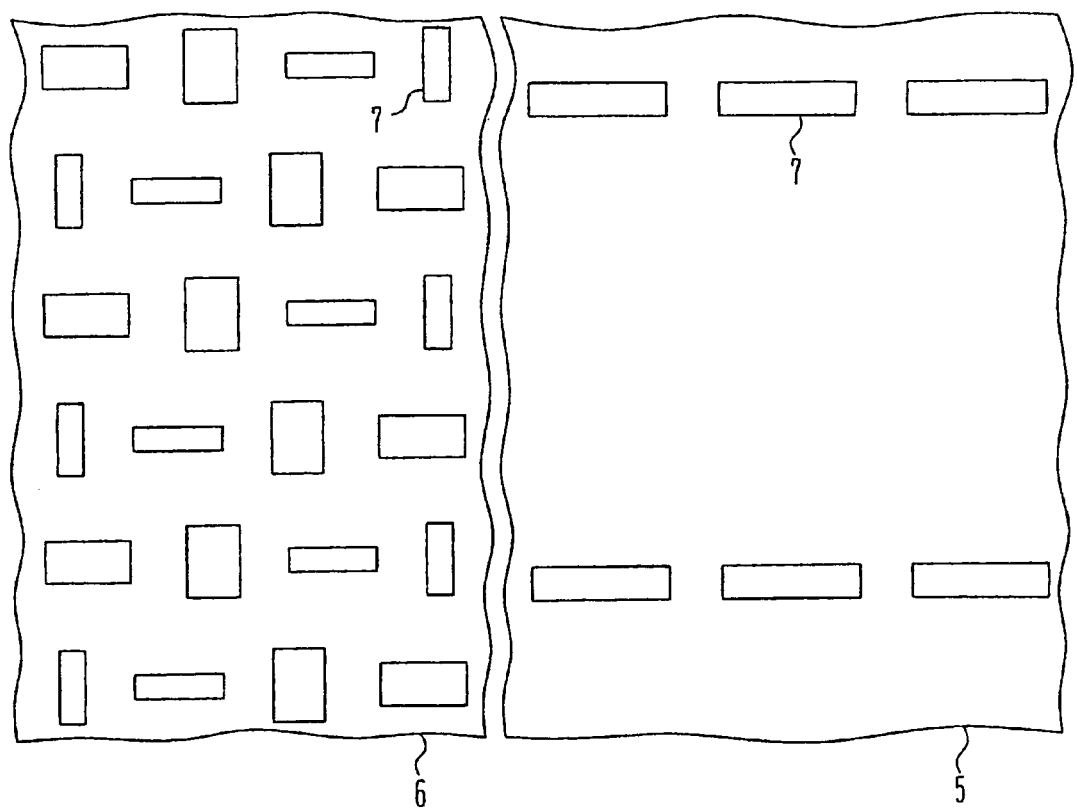
Figure 5:
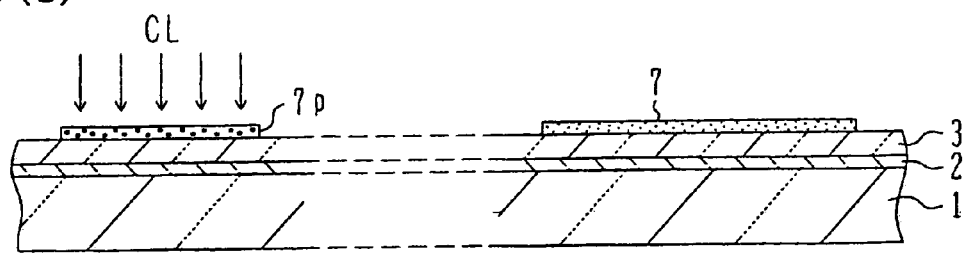
Figure 5:
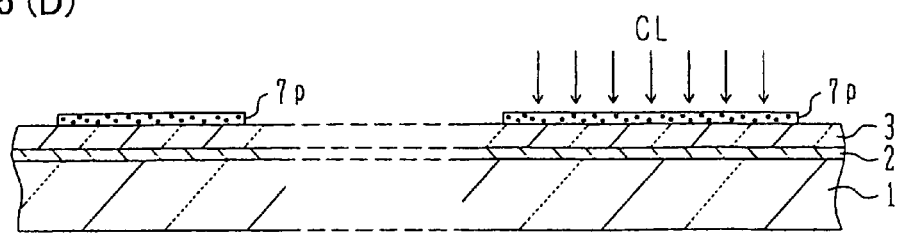
Figure 5:
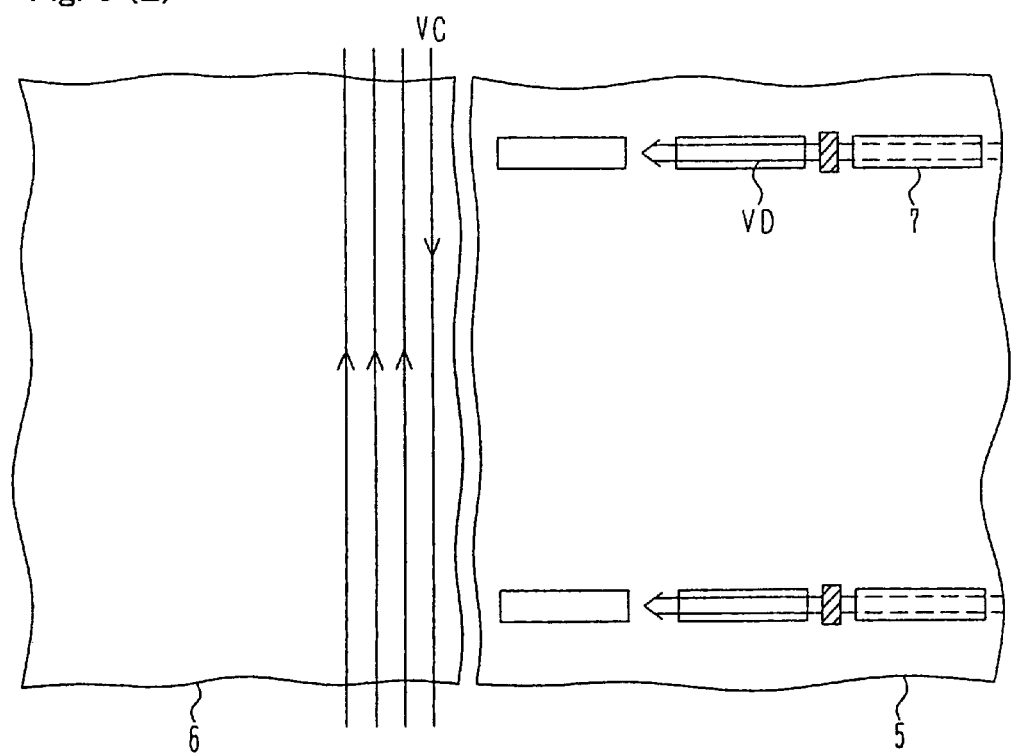
Figure 5:
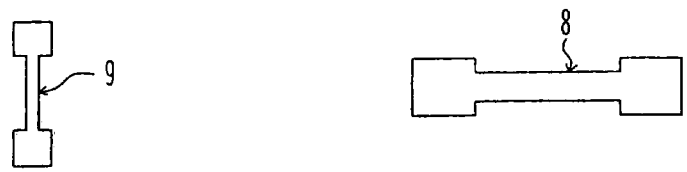
Figure 5:
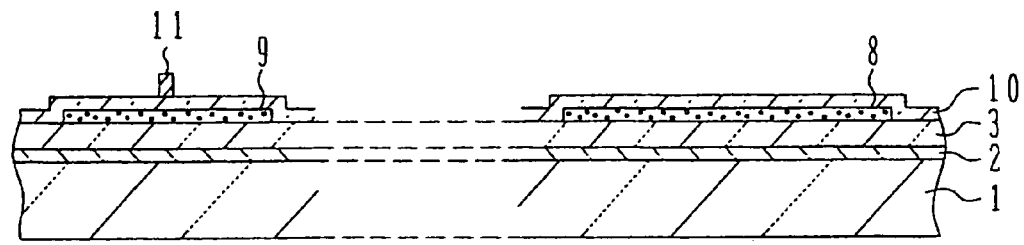
Figure 5:
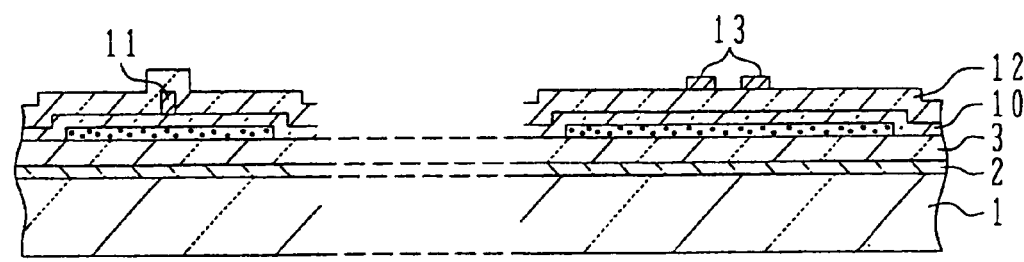
Figure 5:
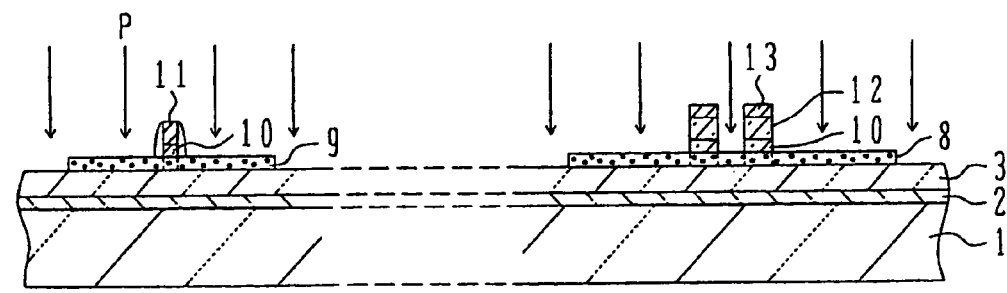
Figure 5:
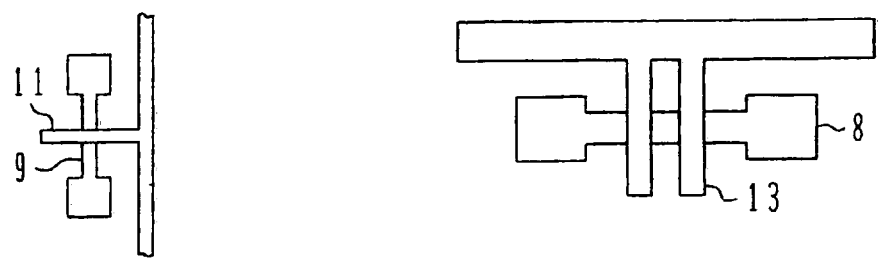
Figure 5:
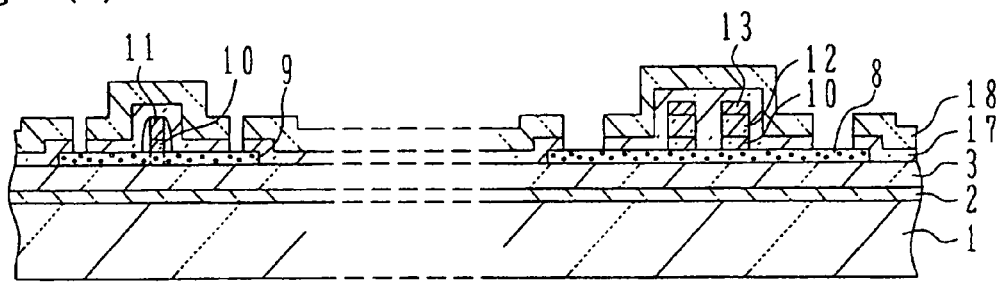
Figure 5:
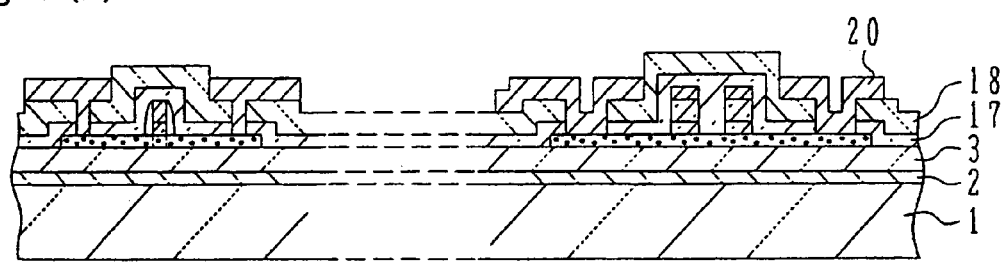
Figure 5:
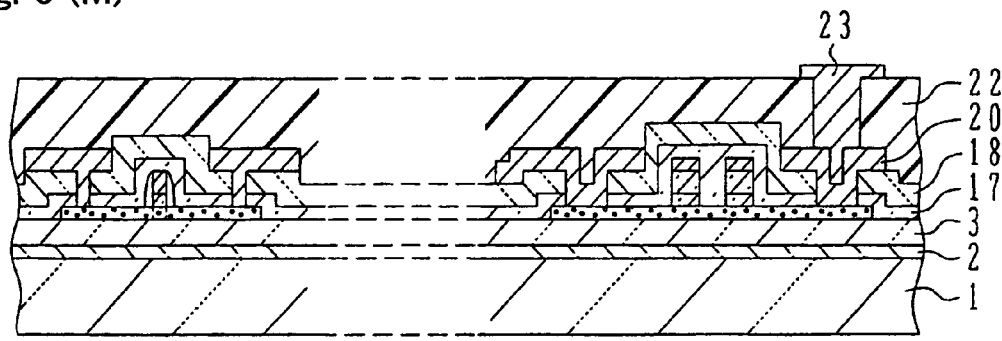

As illustrated in FIG. 5(A), a silicon nitride (SiN) film 2 whose thickness is 50 nm and a silicon oxide ($SiO_2$) film 3 whose thickness is 200 nm are deposited on a glass substrate 1 through plasma enhanced chemical vapor deposition (PE-CVD) and an amorphous silicon film 4 whose thickness is 70 through 100 nm is formed thereon through PE-CVD. After that, hydrogen is extracted from the amorphous silicon film 4 through thermal anneal. A resist pattern is formed on the amorphous silicon film 4 and an insular semiconductor film 7 is obtained by patterning.

FIG. 5(B) schematically illustrates a shape of the insular semiconductor film 7 obtained by patterning. Each insular semiconductor film has a rectangular shape. Each insular semiconductor film is disposed at a position where a TFT is to be formed. In a display area 5, each insular semiconductor film 7 corresponding to a pixel is disposed so that a longer side of the insular semiconductor film 7 is in line with a row direction. In a gate side driving circuit area 6, insular semiconductor films 7 are disposed in a high density manner. In the gate side driving circuit area 6, as with the foregoing embodiment, the insular semiconductor film 7 is disposed so as to satisfy a certain relation with the stripe area to which laser light is irradiated so as to polycrystallize the insular semiconductor film 7.

As illustrated in FIG. 5(C), the insular semiconductor film 7 in the peripheral circuit area is polycrystallized by irradiation of CW laser light CL. An example of a CW laser is one constituted of Nd:YVO$_4$ crystal and a laser diode. The insular semiconductor film 7 becomes a polycrystalline semiconductor film 7p. The insular semiconductor film 7 in the display area remains amorphous.

As illustrated in FIG. 5(D), the insular semiconductor film 7 in the display area is polycrystallized by the CW laser light CL. At that time, it is impossible to sufficiently control the laser light CL in a scanning direction, and accordingly it is inevitable that the laser light CL enters the gate side peripheral circuit area. The arrangement for avoiding the damage on the characteristic of a TFT is made with respect to the area to which the CW laser light CL enters. Therefore, the circuit is hardly influenced.

FIG. 5(E) is a plan view illustrating polycrystallization by the CW laser light illustrated in FIGS. 5(C) and 5(D). First, in the peripheral circuit area 6, the CW laser light scans in line with a track VC and a whole area of the peripheral circuit area 6 is polycrystallized. Next, in the display area 5, the CW laser light scans in line with a track VD so as to polycrystallize only an insular semiconductor film constituting a pixel transistor.

FIG. 5(F) illustrates a state in which: after polycrystallization, the insular semiconductor film is patterned so that a TFT polycrystalline area having an elongate shape whose both ends are widened is formed. In a pixel area, a polycrystalline area 8 having a channel length in a horizontal direction is formed. In the gate side peripheral circuit area, a polycrystalline area 9 having a channel length typically in a vertical direction is formed. Note that: because various TFTs exist in the peripheral circuit area, not only a TFT area having a channel length in a vertical direction but also a TFT area having a channel length in a horizontal direction is formed.

As illustrated in FIG. 5(G), a silicon oxide film 10 whose thickness is approximately 30 nm and an Mo film 11 whose thickness is approximately 300 nm, both of which are used as a low voltage gate insulating film, are formed on the silicon oxide film 3 so as to cover the polycrystalline areas 8 and 9 obtained by patterning the insular semiconductor film. The silicon oxide film 10 is formed through PE-CVD for example and the Mo film 11 is formed through physical vapor deposition (PVD) such as sputtering. A resist pattern having a gate pattern of a low voltage TFT is formed on the Mo film 11 and the Mo film 11 is etched so as to form a gate electrode having the low voltage TFT. Note that: gate wiring is obtained by patterning at the same time as the gate electrode.

As illustrated in FIG. 5(H), an additional silicon oxide film 12 whose thickness is 80 nm for example used as a high voltage gate insulating film is formed on the silicon oxide film 10 through PE-CVD so as to cover the gate electrode 11 obtained by patterning. An Mo film 13 whose thickness is 300 nm is formed on the additional silicon oxide film 12 through sputtering or the like. A resist pattern having a gate pattern of a high voltage TFT is formed on the Mo film 13 and the Mo film 13 is patterned so as to form a gate electrode 13. A pixel TFT is patterned so as to have a double-gate shape. Note that: the gate wiring is obtained by patterning at the same time as the gate electrode. A silicon oxide film is formed on a sidewall of the gate electrode 11 of the low voltage TFT.

As illustrated in FIG. 5(I), an n-type impurity P is ion-doped using the gate electrodes 11 and 13 as masks. An n-type impurity having high density is doped on the polycrystalline semiconductor film on both sides of the gate electrode. A p channel TFT is covered by a resist mask. An n channel TFT is covered by a resist mask and a p-type impurity such as B is ion-doped on a p channel TFT in the peripheral circuit area.

FIG. 5(J) is a plan view illustrating a state in which the gate electrodes 11 and 13 are formed. The gate electrodes 11 and 13 are formed so as to cross narrow areas positioned at middle portions of the polycrystalline semiconductor films 9 and 8, respectively.

As illustrated in FIG. 5(K), a silicon oxide film 17 whose thickness is 10 nm for example is formed so as to cover the formed TFT and then a silicon nitride film 18 whose thickness is 300 nm is formed. A resist pattern is formed on the silicon nitride film 18 and a contact hole for the TFT is opened.

As illustrated in FIG. 5(L), a Ti layer whose thickness is 100 nm for example, an Al layer whose thickness is 200 nm, and a Ti layer whose thickness is 100 nm are laminated through PVD such as sputtering so as to form a film. A resist pattern is formed on the film and etched and patterned so as to form an electrode 20.

As illustrated in FIG. 5(M), an overcoat layer 22 made of organic material is formed on a surface of the TFT substrate so as to cover the electrode 20 so that the surface of the TFT substrate is smoothened. A contact hole for a source electrode is opened in the overcoat layer 22 and a transparent electrode layer 23 such as an ITO is formed. The transparent electrode layer 23 is patterned by using a resist pattern, thereby forming a pixel electrode. In this way, a thin film transistor substrate is formed.

FIGS. 6(A) through 6(E) schematically illustrate methods for producing a thin film transistor substrate according to another embodiment of the present invention.

Figure 6:
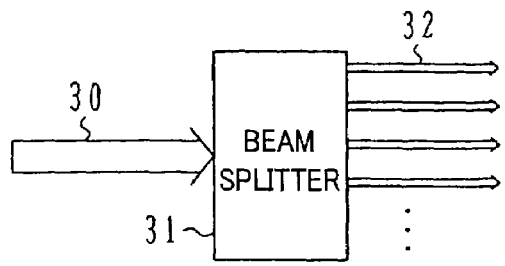
FIGS. 6(A) through 6(E) are a block diagram and plan views explaining how to produce a thin film transistor substrate according to another embodiment.
Figure 6:
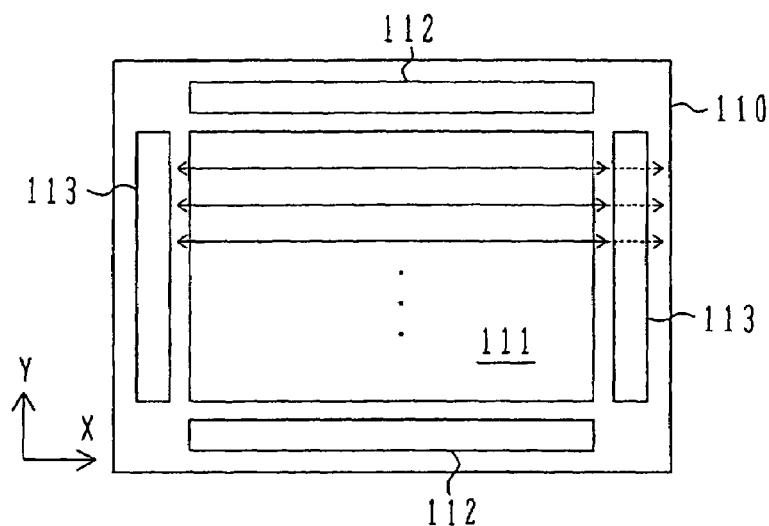
Figure 6:
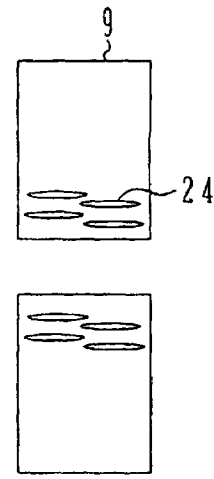
Figure 6:
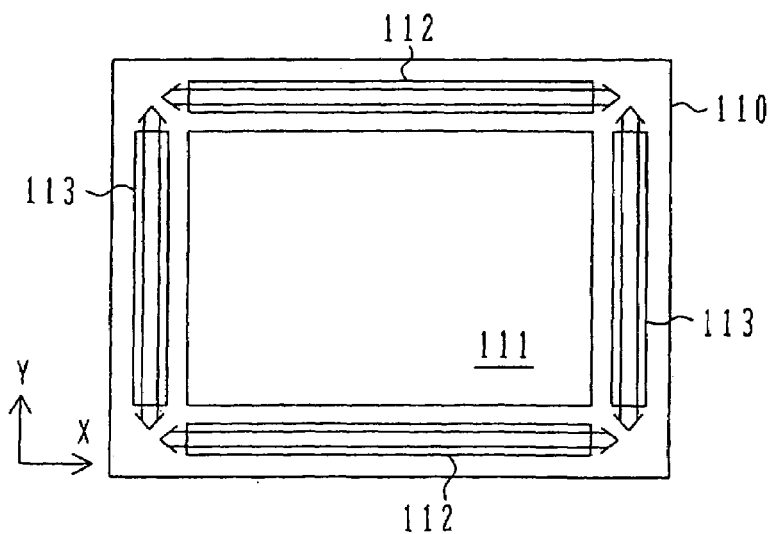
Figure 6:
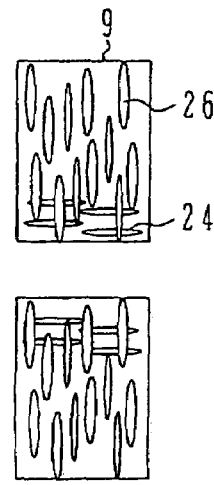

FIG. 6(A) illustrates means for forming a plurality of laser light beams used in polycrystallization of the display area. A CW laser light beam 30 is incident to a beam splitter 31 and a plurality of laser light beams 32 are formed. The laser light beams 32 are positioned so as to polycrystallize plural rows of the insular semiconductor areas in the display area at once.

A laser light beam is divided into a plurality of laser light beams, each of the laser light beams is positioned so as to correspond to each of areas to be polycrystallized, and multiple laser light beams scan at once. As a result, it is possible to reduce a time necessary for polycrystallization of the display area and to perform polycrystallization of the display area efficiently. As illustrated in FIGS. 4(B) and 4(C), limitation on the width of a laser light irradiation area allows the number of divided beams to be increased.

As illustrated in FIG. 6(B), first, polycrystallization of the display area is performed. As illustrated in FIG. 6(A), the polycrystallization can be performed efficiently by irradiating a plurality of laser light beams at once. Particularly, as illustrated in FIG. 4(C), by forming a laser light beam having a narrow width so as to be irradiated only to a channel area of a pixel transistor, it is possible to perform polycrystallization efficiently. Because it is impossible to correctly control a position where the laser light beam stops scanning in a scanning direction, it is inevitable that the laser light beam is irradiated to the gate side driving circuit area 113 disposed on right and left sides of the display area.

FIG. 6(C) schematically illustrates a state of the insular semiconductor area in the gate side driving circuit. In the gate side driving circuit area, laser light is irradiated and a polycrystalline grain 24 which is elongate in a horizontal direction is formed.

FIG. 6(D) illustrates polycrystallization of the peripheral circuit area which is performed thereafter. The drain side driving circuit areas 112 and the gate side driving circuit areas 113 are scanned by laser light in a direction in line with directions of their longer sides, and whole areas are polycrystallized.

FIG. 6(E) schematically illustrates a state of the insular semiconductor layer in the polycrystalline gate side peripheral circuit area. A polycrystalline grain 26 that is elongate in a vertical direction is formed by irradiation of laser light illustrated in FIG. 6(D). As illustrated in FIG. 6(C), the polycrystalline grain 24 having been polycrystallized in the polycrystallization of the display area is overlapped by the newly formed polycrystalline grain 26, with a result that the polycrystalline grain 24 is divided. It was found that: when a TFT whose channel length is vertical is made of an area having been scanned by a horizontal direction and then in a vertical direction, the TFT has a higher characteristic. Therefore, by selecting orders of polycrystallization according to this embodiment, it is possible to obtain a peripheral circuit having a higher characteristic without adjusting a position of a TFT in the gate side driving circuit area.

The foregoing explains the present invention with reference to the embodiments. However, the present invention is not limited to the embodiments. Materials and thickness in the embodiments are variable according to design. A transparent insulating substrate such as a silicon dioxide substrate may be used instead of a glass substrate. In addition to B and P, examples of the p-type impurity and the n-type impurity include Sb and As. The gate insulating film may be made of an insulating layer other than a silicon oxide film. For example, a silicon oxide nitride film, a silicon nitride film, and an organic insulating layer are applicable.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A thin film transistor substrate, comprising:
a transparent insulating substrate which includes a display area and a peripheral area;
a large number of pixel thin film transistors which are disposed in a matrix manner on the display area, each of said pixel thin film transistors including a channel made of a polycrystalline semiconductor film whose mobility is higher in a first direction than in another direction, a channel length direction being in line with the first direction, and channels included in a plurality of pixel thin film transistors being disposed respectively in stripe areas each of which has a predetermined width and is elongate in the first direction; and
a plurality of peripheral circuits which are disposed in the peripheral area so as to be positioned on a portion including extended portions of the stripe areas and which include a plurality of thin film transistors each made of a polycrystalline semiconductor film whose mobility is higher in a second direction crossing the first direction than in another direction, at least one peripheral circuit out of said plurality of peripheral circuits including a high speed thin film transistor whose channel length direction is in line with the second direction, and a channel of the high speed thin film transistor being positioned on a portion other than the extended portions of the stripe areas.

2. The thin film transistor substrate as set forth in claim 1, wherein: said at least one peripheral circuit includes a plurality of peripheral circuit thin film transistors whose channel length direction is in line with the second direction; and channels of the plurality of peripheral circuit thin film transistors are positioned on the portion other than the extended portions of the stripe areas.

3. The thin film transistor substrate as set forth in claim 1, wherein: said at least one peripheral circuit further includes other one or more peripheral circuit thin film transistors whose channel length direction is in line with a direction other than the second direction; and channels of all peripheral circuit thin film transistors included in said at least one peripheral circuit are positioned on the portion other than the extended portions of the stripe areas.

4. The thin film transistor substrate as set forth in claim 1, wherein semiconductors constituting all peripheral circuit thin film transistors included in said at least one peripheral circuit are positioned on the portion other than the extended portions of the stripe areas.

5. The thin film transistor substrate as set forth in claim 1, wherein said at least one peripheral circuit is a shift register of a gate control circuit.

* * * * *